United States Patent
Douskey et al.

(10) Patent No.: US 8,627,162 B2
(45) Date of Patent: Jan. 7, 2014

(54) IIMPLEMENTING ENHANCED APERTURE FUNCTION CALIBRATION FOR LOGIC BUILT IN SELF TEST (LBIST)

(75) Inventors: Steven M. Douskey, Rochester, MN (US); Ryan A. Fitch, Southfield, MI (US); Michael J. Hamilton, Rochester, MN (US); Amanda R. Kaufer, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 43 days.

(21) Appl. No.: 13/316,620

(22) Filed: Dec. 12, 2011

(65) Prior Publication Data

US 2013/0151918 A1    Jun. 13, 2013

(51) Int. Cl.
  *G01R 31/28*    (2006.01)
(52) U.S. Cl.
  USPC .......................................... 714/733; 714/745
(58) Field of Classification Search
  USPC .................. 381/59; 324/750.3, 202; 265/226;
        702/123, 107; 455/113; 714/401, 718,
        714/733, 745
  See application file for complete search history.

(56) References Cited

U.S. PATENT DOCUMENTS

| | | | | |
|---|---|---|---|---|
| 7,602,923 B2* | 10/2009 | Lee et al. | | 381/59 |
| 7,847,572 B2* | 12/2010 | Watanabe et al. | | 324/750.3 |
| 8,254,200 B2* | 8/2012 | Eid et al. | | 365/226 |
| 8,386,209 B2* | 2/2013 | Mullane et al. | | 702/123 |
| 2002/0143485 A1* | 10/2002 | Chen et al. | | 702/107 |
| 2008/0233900 A1* | 9/2008 | Baker | | 455/113 |
| 2011/0258475 A1* | 10/2011 | Lee et al. | | 713/401 |
| 2012/0274314 A1* | 11/2012 | Cesaretti et al. | | 324/202 |

* cited by examiner

*Primary Examiner* — David Ton
(74) *Attorney, Agent, or Firm* — Joan Pennington

(57) ABSTRACT

A method and circuits for implementing aperture function calibration for Logic Built In Self Test (LBIST) diagnostics, and a design structure on which the subject circuit resides are provided. The aperture function calibration uses aperture calibration data, and an LBIST calibration channel having a predefined number of scan inversions between the aperture calibration data and a multiple input signature register (MISR). LBIST is run selecting the LBIST calibration channel and masking other LBIST channels to the MISR. A change in the MISR value, for example, from zero to a non-zero value, is identified and an aperture adjustment is calculated and used to identify any needed adjustment of aperture edges.

20 Claims, 12 Drawing Sheets

UPPER EDGE: EXPECTED = 3

ADJUSTED UPPER EDGE = UPPER EDGE – ( CALIBRATION LENGTH - 1)

ADJUSTED UPPER EDGE = 18 – ( 16 -1) = 3

EXPECTED AND ADJUSTED MATCH → NO APERTURE ADJUSTMENT

LOWER EDGE: EXPECTED = 0

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 6 | APERTURE WINDOW 730 | | | | | | | | | | | | | | 31 |

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 7 | APERTURE WINDOW 732 | | | | | | | | | | | | | | 31 |

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 16 | APERTURE WINDOW 734 | | | | | | | | | | | | | | 31 |

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 17 | APERTURE WINDOW 736 | | | | | | | | | | | | | | 31 |

ADJUSTED LOWER EDGE = LOWER EDGE − ( CALIBRATION LENGTH + 1)

ADJUSTED LOWER EDGE = 17 − ( 16 + 1) = 0

EXPECTED AND ADJUSTED MATCH → NO APERTURE ADJUSTMENT

FIG. 7C

UPPER EDGE: EXPECTED = 3

ADJUSTED UPPER EDGE = UPPER EDGE − ( CALIBRATION LENGTH - 1)

ADJUSTED UPPER EDGE = 20 − ( 16 -1 ) = 5

UPPER EDGE ADJUSTMENT = +2

LOWER EDGE: EXPECTED = 0

| 0 | 1 | 2 | 3 | 4 | 5 | 6 | 7 | 8 | 9 | 10 | 11 | 12 | 13 | 14 | 15 |

6     APERTURE WINDOW 810                                    31

| 0 | 1 | 2 | 3 | 4 | 5 | 6 | 7 | 8 | 9 | 10 | 11 | 12 | 13 | 14 | 15 |

7     APERTURE WINDOW 812                                    31

| 0 | 1 | 2 | 3 | 4 | 5 | 6 | 7 | 8 | 9 | 10 | 11 | 12 | 13 | 14 | 15 |

18    APERTURE WINDOW 814                                    31

| 0 | 1 | 2 | 3 | 4 | 5 | 6 | 7 | 8 | 9 | 10 | 11 | 12 | 13 | 14 | 15 |

19    APERTURE WINDOW 816                                    31

ADJUSTED LOWER EDGE = LOWER EDGE − ( CALIBRATION LENGTH + 1)

ADJUSTED LOWER EDGE = 19 − ( 16 + 1) = 2

LOWER EDGE ADJUSTMENT = +2

IIMPLEMENTING ENHANCED APERTURE FUNCTION CALIBRATION FOR LOGIC BUILT IN SELF TEST (LBIST)

FIELD OF THE INVENTION

The present invention relates generally to the data processing field, and more particularly, relates to a method and circuit for implementing aperture function calibration for Logic Built In Self Test (LBIST) diagnostics, and a design structure on which the subject circuit resides.

DESCRIPTION OF THE RELATED ART

When testing integrated circuits or chips, techniques such as Logic Built In Self Test (LBIST) diagnostics advantageously are used to test memory arrays and logic.

An aperture function can be used to debug LBIST failures on a chip by masking certain bits from contributing to the MISR signature. To do this effectively, the aperture edges must be controlled precisely.

In some known LBIST diagnostics arrangements, when the aperture edges are misaligned, it has proven difficult to determine the severity or direction of the misalignment in system. The misaligned aperture edges reduces the confidence in the results and requires additional analysis of latches before and after an identified defective latch in the scan path from the LBIST diagnostics, and can substantially increase the overall LBIST diagnostics or debug time.

A need exists for a circuit having an efficient and effective mechanism for calibrating the aperture function for LBIST.

SUMMARY OF THE INVENTION

Principal aspects of the present invention are to provide a method and circuit for implementing aperture function calibration for Logic Built In Self Test (LBIST) diagnostics, and a design structure on which the subject circuit resides. Other important aspects of the present invention are to provide such method, circuit and design structure substantially without negative effects and that overcome many of the disadvantages of prior art arrangements.

In brief, a method and circuits for implementing aperture function calibration for Logic Built In Self Test (LBIST) diagnostics, and a design structure on which the subject circuit resides are provided. The aperture function calibration uses aperture calibration data, and an LBIST calibration channel having a predefined number of scan inversions between the aperture calibration data and a multiple input signature register (MISR). LBIST is run selecting the LBIST calibration channel and masking other LBIST channels to the MISR. A change in the MISR value, for example, from zero to a non-zero value, is identified and an aperture adjustment is calculated and used to identify any needed adjustment of aperture edges.

In accordance with features of the invention, a calibration software mode configures a no clocks run for the LBIST run, which selects the LBIST calibration channel and masks other LBIST channels to the MISR, enabling the aperture upper and lower edges to be easily be calibrated in system. The aperture function calibration reduces the amount of debug time related to misaligned edges, reducing the overall LBIST debug time.

BRIEF DESCRIPTION OF THE DRAWINGS

The present invention together with the above and other objects and advantages may best be understood from the following detailed description of the preferred embodiments of the invention illustrated in the drawings, wherein:

FIGS. 7A, 7B, and 7C illustrate example calibration operations for implementing aperture function calibration for Logic Built In Self Test (LBIST) diagnostics in accordance with a preferred embodiment;

FIGS. 8A, and 8B illustrate other example calibration operations for implementing aperture function calibration for Logic Built In Self Test (LBIST) diagnostics in accordance with a preferred embodiment.

DETAILED DESCRIPTION OF THE PREFERRED EMBODIMENTS

Figure 1:
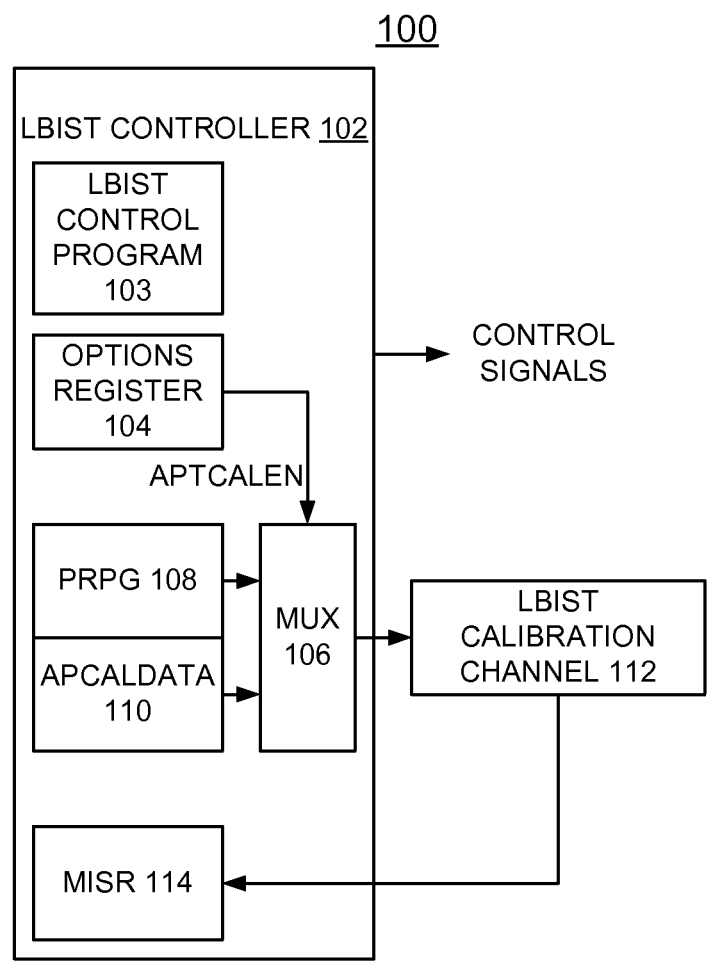
FIGS. 1, 2, 3, and 4 respectively provide a schematic and block diagram representation illustrating an example LBIST controller circuit and respective example aperture calibration data circuits for implementing aperture function calibration for Logic Built In Self Test (LBIST) diagnostics in accordance with a preferred embodiment.
Figure 2:
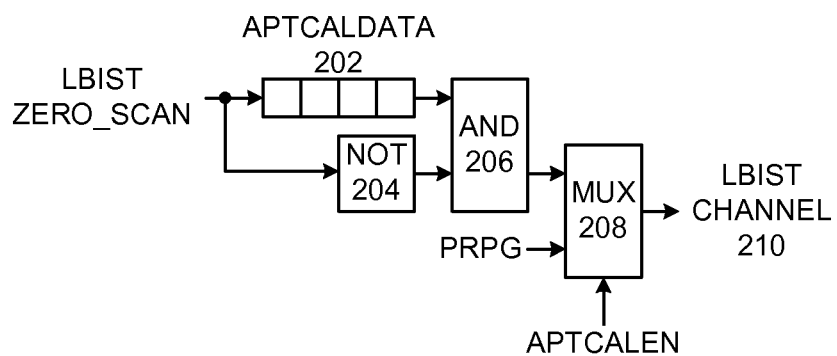

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits for implementing aperture function calibration for Logic Built In Self Test (LBIST) diagnostics in accordance with a preferred embodiment, and a design structure on which the subject circuits resides are provided.

Having reference now to the drawings, in FIGS. 1, 2, 3, and 4, there are shown respective example circuits for implementing aperture function calibration for Logic Built In Self Test (LBIST) diagnostics respectively generally designated by the reference characters 100, 200, 300, and 400 in accordance with preferred embodiments.

LBIST aperture function calibration circuit 100 includes an LBIST controller 102 including LBIST control program 103 in accordance with preferred embodiments generating control signals for implementing aperture function calibration. The LBIST control program 103 is a computer program product tangibly embodied on a non-transitory computer readable storage medium including program means or program instructions for carrying out the methods for implementing aperture function calibration of the preferred embodiments. LBIST controller 102 includes an options register 104 providing an aperture calibration enable signal APT-CALEN to a multiplexer 106 in accordance with preferred embodiments. The multiplexer 106 receives a respective input from a pseudo-random pattern generator (PRPG) 108, and aperture calibration data APTCALDATA providing an input to an LBIST calibration channel 112 responsive to the activated aperture calibration enable signal APTCALEN. The aperture calibration enable signal APTCALEN is the option bit that inserts the APTCALDATA into the LBIST channel 112. The LBIST calibration channel 112 provides an input to a multiple input signature register (MISR) 114.

Aperture function calibration circuit 200 includes an APTCALDATA 202, for example, that is small scan chain inside of the LBIST logic 200, which is not part of the normal LBIST channels. APTCALDATA 202 receives an LBIST zero-scan, which also is applied by a NOT gate 204 to an input of an AND gate 206. APTCALDATA 202 provides a second input to the AND gate 206. The AND gate output is applied to a multiplexer 208 receives a second input from a pseudo-random pattern generator (PRPG), such as the PRPG 108. The multiplexer 208 provides an input to an LBIST calibration channel 210. The aperture calibration enable signal APTCALEN applied to multiplexer 208 is the option bit that inserts the APTCALDATA into the LBIST channel 210.

During the calibration test using aperture function calibration circuit 200, APTCALDATA 202 is initialized to all ones (1s) during the initial LBIST zero-scan, while the normal LBIST channel would be scanned to zeroes (0s) like a normal LBIST run. For the remaining LBIST cycles, the APTCALDATA scan input would be held to a 0 and the LBIST channel 210 would be fed by the APTCALDATA.

Figure 3:
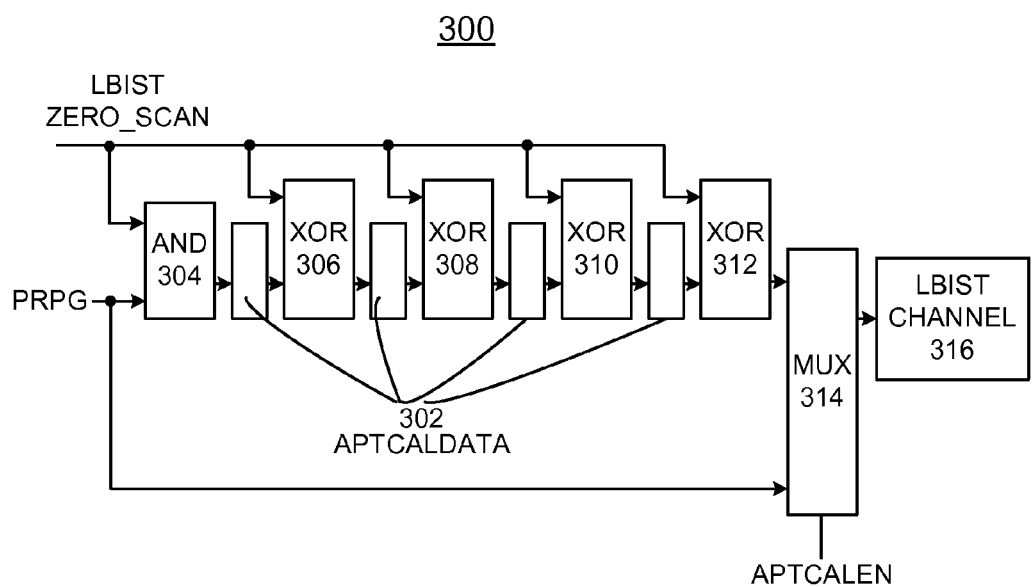

Aperture function calibration circuit 300 of FIG. 3 is a similar structure to the structure of aperture function calibration circuit 200. Aperture function calibration circuit 300 includes an APTCALDATA 302, a two-input AND gate 304 receiving an input LBIST zero-scan and a second input from a pseudo-random pattern generator (PRPG), such as the PRPG 108. The AND gate output is applied to APTCALDATA 302 and coupled by a plurality of XOR gates 306, 308, 310, 312 to an input of a multiplexer 314. The multiplexer 314 receives a second input from the pseudo-random pattern generator (PRPG), such as the PRPG 108. The multiplexer 314 provides an input to an LBIST calibration channel 316. The aperture calibration enable signal APTCALEN applied to multiplexer 314 is the option bit that inserts the APTCALDATA into the LBIST channel 314.

In aperture function calibration circuit 300, the APTCALDATA 302 is initialized to a pattern (0101) through the even number of XORs 306, 308, 310, 312 and scanned during the initial LBIST zero_scan. The same APTCALDATA 302 is inserted to one or more channels. It should be understood that the APTCALEN signal could be altered to a control signal based off the scan cycle count to allow the insertion of the APTCALDATA into any position in the LBIST channel, without requiring modifications to the chip channels.

Figure 4:
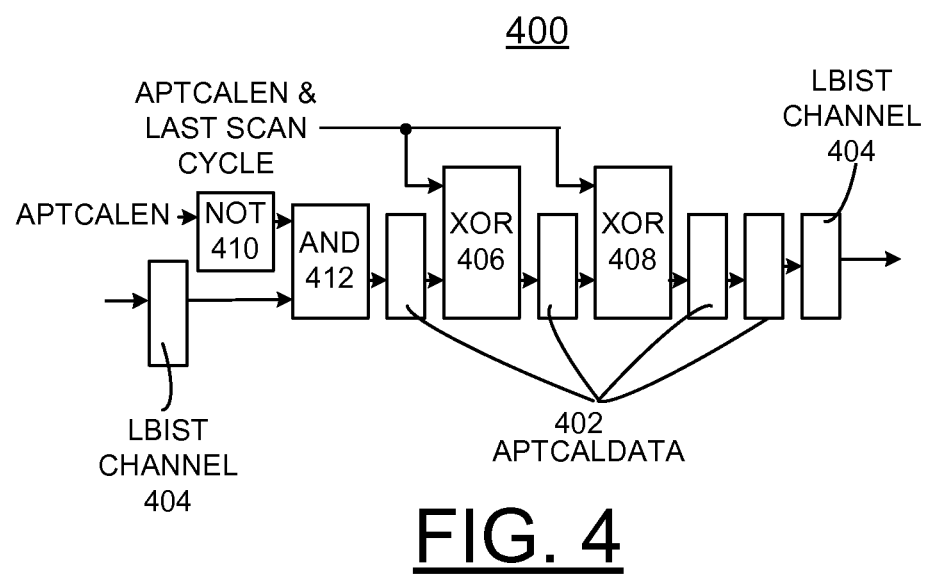

Aperture function calibration circuit 400 of FIG. 4 is part of the normal LBIST channels, eliminating the multiplexer 208, 314 of respective aperture function calibration circuits 200, 300. Aperture function calibration circuit 400 includes APTCALDATA 402 applied to a section of a LBIST channel 404 through a pair of XOR gates 406, 408. The XOR gates 406, 408 receive the aperture calibration enable signal APTCALEN and Last Scan Cycle input. Aperture function calibration circuit 400 includes a NOT gate 410 receiving the APTCALEN signal and providing an input to an AND gate 412. A different section of the LBIST channel 404 provides a second input to the AND gate 412, which provides an input to the APTCALDATA 402.

In aperture function calibration circuit 400, where APTCALDATA is part of the normal LBIST channels, when APTCALEN is not asserted, the APTCALDATA 402 latches are not modified during a normal LBIST run. When APTCALEN is asserted, the APTCALDATA is initialized to 0110 on the last zero scan cycle. For the remaining LBIST cycles the APTCALDATA scan input is held to a 0.

It should be understood that in each of the aperture function calibration circuits 200, 300, and 400, the APTCALDATA also can be held to 0s by masking the PRPG data to the calibration channel, eliminating the need for the extra logic at the scan-in.

In accordance with features of the invention, the LBIST control program 103 configures the LBIST controller 102 to perform a no clocks run. A channel that has an even number of scan inversions between the APCALDATA and the MISR is selected as the calibration channel, such as LBIST calibration channel 112 of FIG. 1, while the rest of the channels feeding the MISR are masked. The MISR is written or defaulted to all 0s.

In accordance with features of the invention, the number of test loops is set to something short such as two cycles. The channel length should be set, for example, to the length of the calibration channel plus 15, effectively moving the APTCALDATA from the end of the channel to the middle of the channel. Over-scanning will not affect the APTCALDATA because the scan-in is held to 0.

In accordance with features of the invention, an Aperture Enable and APTCALEN bits are set with the aperture sense set to positive. A positive aperture sense masks the data between the aperture edges from feeding the MISR. Initially, the upper aperture edge should be set for the length of the calibration channel length plus 15 and the lower edge should be set, for example, to the calibration channel length minus 10.

In accordance with features of the invention, when LBIST is run, the result in the MISR should be zero. The test should be rerun, while incrementing the lower edge until the MISR value is non-zero. A non-zero value indicates the APTCALDATA has been scanned into the MISR without being masked; pin-pointing the lower edge. The adjusted lower edge is the difference between the Lower Edge and (the Calibration Length+1). To align the upper edge, the process should be repeated with decrementing the upper edge. The adjusted upper edge is the difference between the Upper Edge and (the Calibration Length−1).

Figure 5:
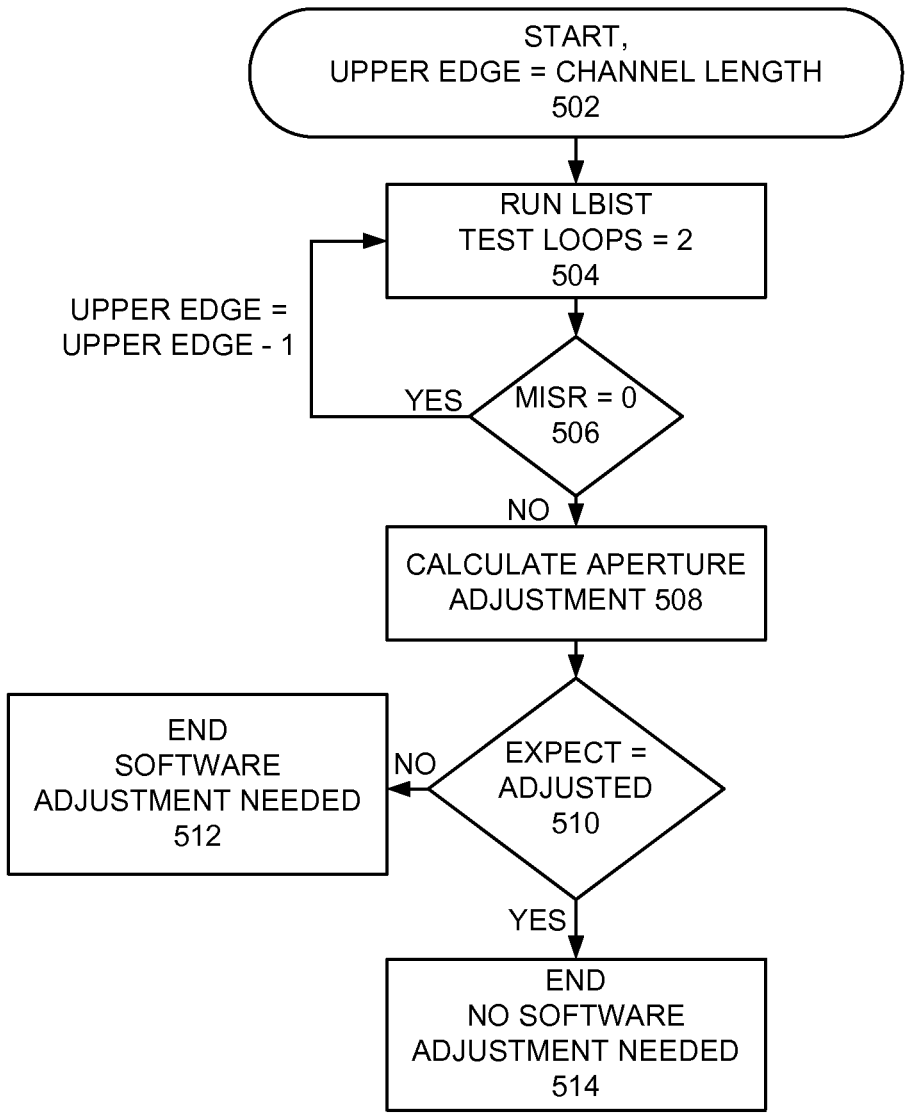
FIGS. 5 and 6 are flow diagrams illustrating example operations for implementing aperture function calibration for Logic Built In Self Test (LBIST) diagnostics in accordance with a preferred embodiment.
Figure 6:
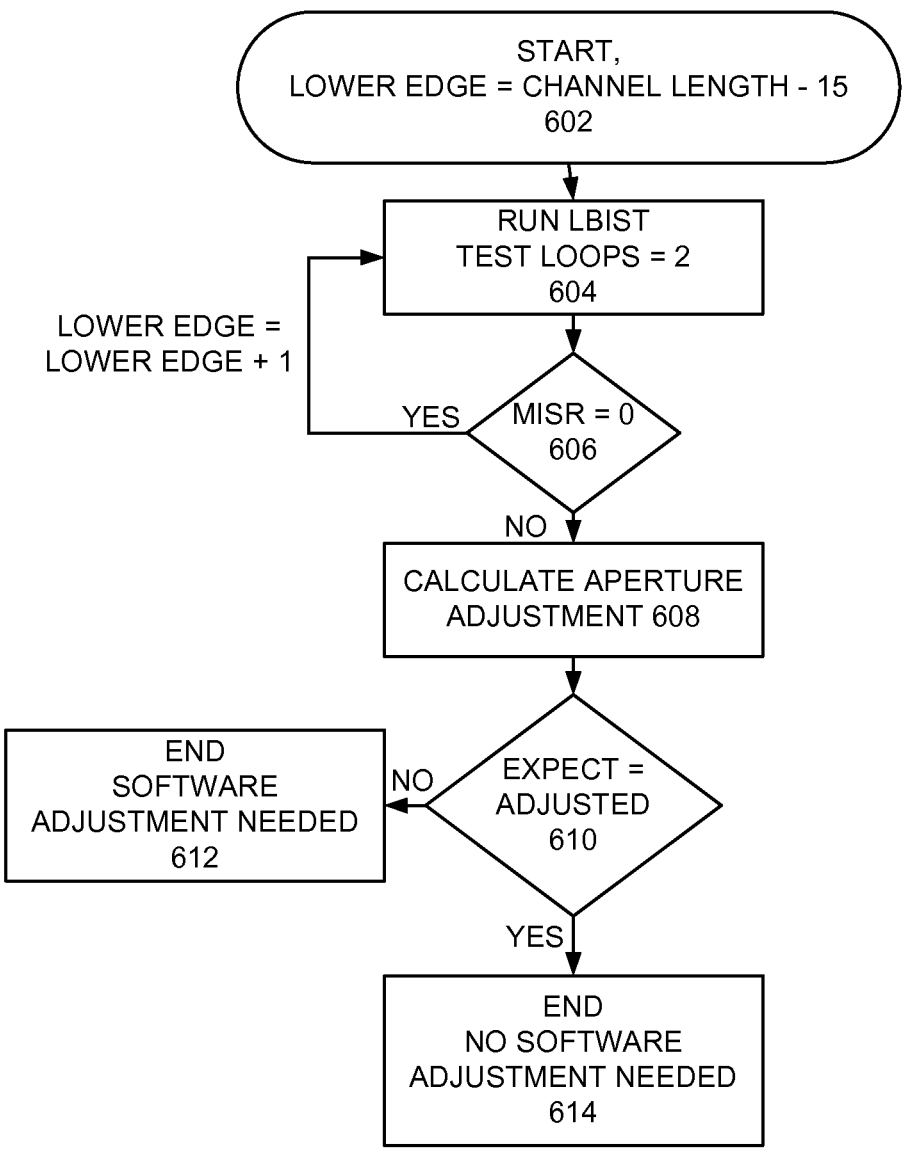

Referring to FIGS. 5 and 6, there are shown example operations for implementing aperture function calibration for Logic Built In Self Test (LBIST) diagnostics in accordance with a preferred embodiment.

In accordance with features of the invention, the aperture function calibration uses aperture calibration data, and an LBIST calibration channel having a predefined number of scan inversions between the aperture calibration data and the multiple input signature register (MISR). LBIST is run selecting the LBIST calibration channel and masking other LBIST channels to the MISR. A change in the MISR value, for example, from zero to a non-zero value, is identified and an aperture adjustment is calculated to identify aperture edges.

In accordance with features of the invention, a calibration software mode configures a no clocks run for the LBIST run, which selects the LBIST calibration channel and masks other LBIST channels to the MISR, enabling the aperture upper and lower edges to be easily be calibrated in system. The aperture function calibration reduces the amount of debug time related to misaligned edges, reducing the overall LBIST debug time.

In FIG. 5, as indicated at a block 502, operations to align the upper edge of the aperture function start with the upper edge set to the channel length. LBIST is run with test loops set to 2 as indicated at a block 504. Checking whether the MISR value equals 0 is performed as indicated at a decision block 506. When the MISR value equals 0, then the upper edge is decremented by 1 and LBIST is run at block 504. When the MISR value is a non-zero value or not equal to 0, then an aperture adjustment is calculated as indicated at a block 508 to identify the upper aperture edge. Checking whether the expected value equals the adjusted value is performed as indicated at a decision block 510. When the expected value does not equal the adjusted value, then the operations end with software adjustment needed as indicated at a block 512. When the expected value equals the adjusted value, then the operations end with no software adjustment needed as indicated at a block 514.

In FIG. 6, as indicated at a block 602, operations to align the lower edge of the aperture function start with the lower edge set to the channel length less 15. LBIST is run with test loops set to 2 as indicated at a block 604. Checking whether the MISR value equals 0 is performed as indicated at a decision block 606. When the MISR value equals 0, then the lower edge is incremented by 1 and LBIST is run at block 604. When the MISR value is a non-zero value or not equal to 0, then an aperture adjustment is calculated as indicated at a block 608 to identify the lower aperture edge. Checking whether the expected value equals the adjusted value is performed as indicated at a decision block 610. When the expected value does not equal the adjusted value, then the operations end with software adjustment needed as indicated at a block 612. When the expected value equals the adjusted value, then the operations end with no software adjustment needed as indicated at a block 614.

Figure 7A:
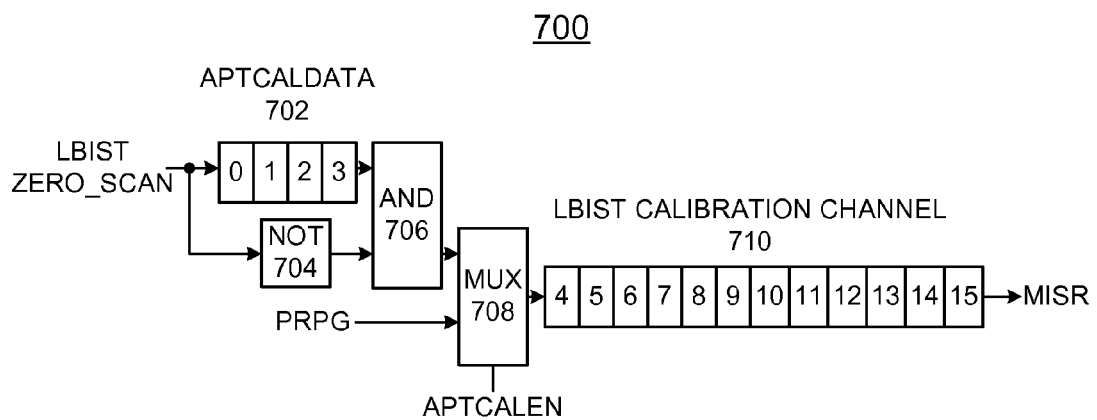
Figure 7B:
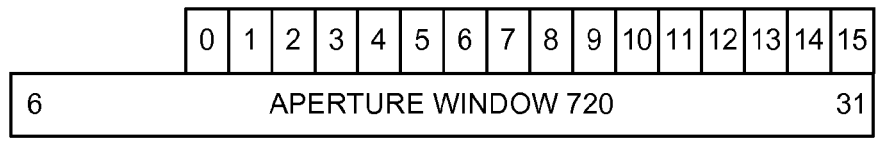
Figure 7B:
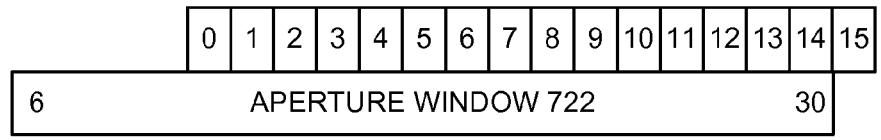
Figure 7B:
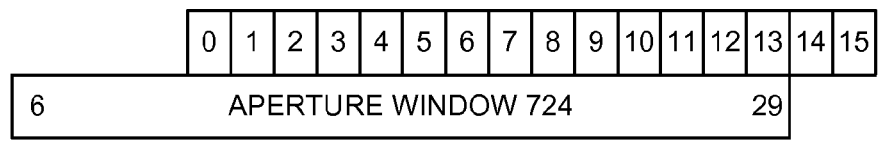
Figure 7B:
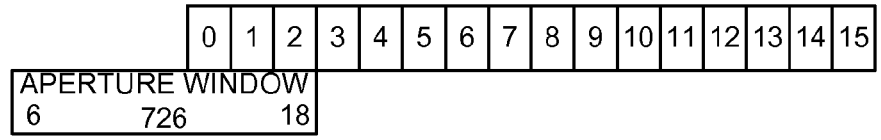

FIGS. 7A, 7B, and 7C illustrate example LBIST aperture calibration logic 700 and example calibration operations for implementing aperture function calibration for Logic Built In Self Test (LBIST) diagnostics in accordance with a preferred embodiment. In FIG. 7A, APTCALDATA 702 is a four latch scan chain inside of the LBIST logic 700, which is not part of the normal LBIST channels. APTCALDATA 702 and a NOT gate 704 receives an LBIST zero-scan and respectively provide an input of an AND gate 706. The AND gate output is applied to a multiplexer 708, which receives a second input from a pseudo-random pattern generator (PRPG), such as the PRPG 108. The multiplexer 708 provides an input to an LBIST calibration channel 710. The activated aperture calibration enable signal APTCALEN applied to multiplexer 708 inserts the APTCALDATA into the LBIST channel 710.

FIGS. 7B, 7C, and 8A, 8B provide respective examples using the LBIST aperture calibration logic 700 showing example calibration operations for implementing aperture function calibration for Logic Built In Self Test (LBIST) diagnostics in accordance with a preferred embodiment.

FIG. 7B illustrates example operations to align the upper edge of the aperture function including aperture windows 720, 722, 724, and 726. As shown, the Expected upper Edge=3. The Adjusted Upper Edge=Upper Edge−(Calibration Length−1). The Adjusted Upper Edge of aperture window 726=18−(16−1)=3. The expected and adjusted upper edges match so no aperture adjustment is needed.

FIG. 7C illustrates example operations to align the lower edge of the aperture function including aperture windows 730, 732, 734, and 736. As shown, the Expected lower Edge=0. The Adjusted Lower Edge=Lower Edge−(Calibration Length+1). The Adjusted Lower Edge of aperture window 726=17−(16+1)=0. The expected and adjusted lower edges match so no aperture adjustment is needed.

Figure 8A:
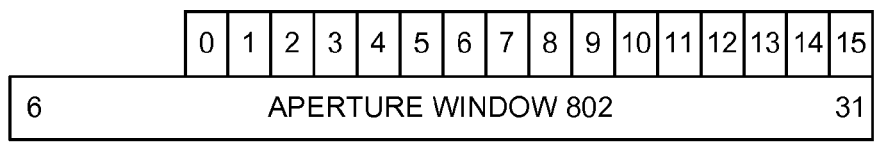
Figure 8A:
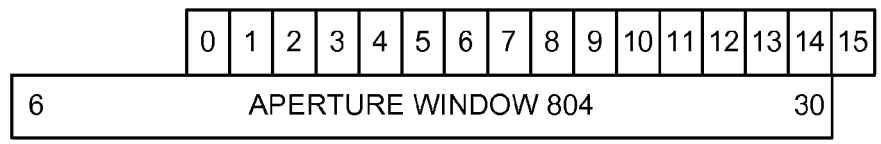
Figure 8A:
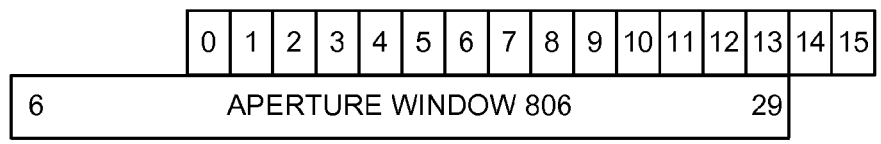
Figure 8A:
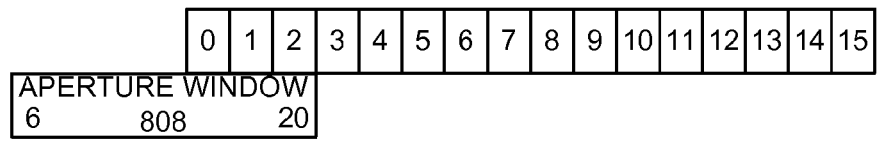

FIG. 8A illustrates example operations to align the upper edge of the aperture function including aperture windows 802, 804, 806, 808. As shown, the Expected upper Edge=3. The Adjusted Upper Edge=Upper Edge−(Calibration Length−1). The Adjusted Upper Edge of aperture window 808=20−(16−1)=5. The aperture adjustment of +2 is needed.

FIG. 8B illustrates example operations to align the lower edge of the aperture function including aperture windows 810, 812, 814, 816. As shown, the Expected lower Edge=0. The Adjusted Lower Edge=Lower Edge−(Calibration Length+1). The Adjusted Lower Edge of aperture window 816=19−(16+1)=2. The aperture adjustment of +2 is needed.

Figure 9:
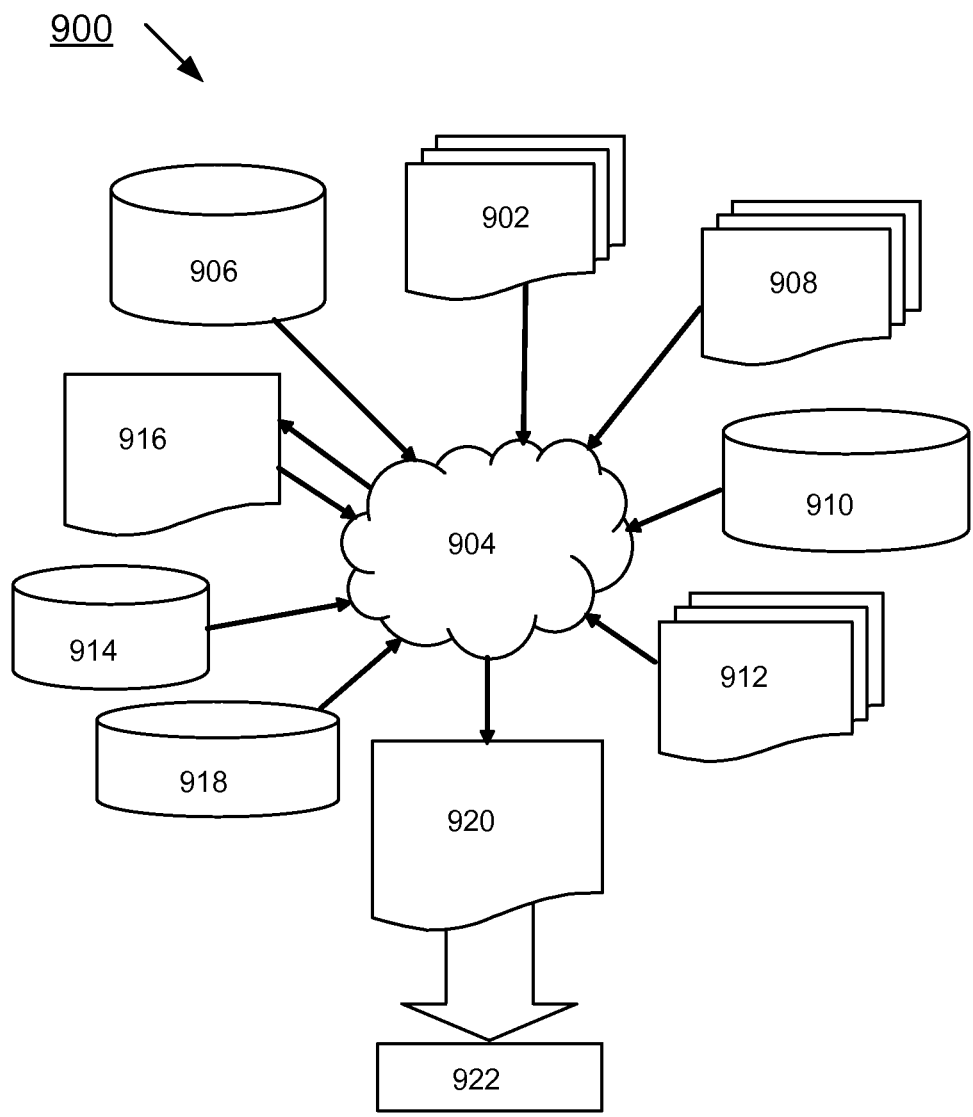
FIG. 9 is a flow diagram of a design process used in semiconductor design, manufacturing, and/or test.

FIG. 9 shows a block diagram of an example design flow 900. Design flow 900 may vary depending on the type of IC being designed. For example, a design flow 900 for building an application specific IC (ASIC) may differ from a design flow 900 for designing a standard component. Design structure 902 is preferably an input to a design process 904 and may come from an IP provider, a core developer, or other design company or may be generated by the operator of the design flow, or from other sources. Design structure 902 comprises circuits 100, 200, 300, and 400 in the form of schematics or HDL, a hardware-description language, for example, Verilog, VHDL, C, and the like. Design structure 902 may be contained on one or more machine readable medium. For example, design structure 902 may be a text file or a graphical representation of circuits 100, 200, 300, and 400. Design process 904 preferably synthesizes, or translates, circuits 100, 200, 300, and 400 into a netlist 906, where netlist 906 is, for example, a list of wires, transistors, logic gates, control circuits, I/O, models, etc. that describes the connections to other elements and circuits in an integrated circuit design and recorded on at least one of machine readable medium. This may be an iterative process in which netlist 906 is resynthesized one or more times depending on design specifications and parameters for the circuit.

Design process 904 may include using a variety of inputs; for example, inputs from library elements 908 which may house a set of commonly used elements, circuits, and devices, including models, layouts, and symbolic representations, for a given manufacturing technology, such as different technology nodes, 32 nm, 45 nm, 90 nm, and the like, design specifications 910, characterization data 912, verification data 914, design rules 916, and test data files 918, which may include test patterns and other testing information. Design process 904 may further include, for example, standard circuit design processes such as timing analysis, verification, design rule checking, place and route operations, and the like. One of ordinary skill in the art of integrated circuit design can appreciate the extent of possible electronic design automation tools and applications used in design process 904 without deviating from the scope and spirit of the invention. The design structure of the invention is not limited to any specific design flow.

Design process 904 preferably translates an embodiment of the invention as shown in FIGS. 1, 2, 3, and 4 along with any additional integrated circuit design or data (if applicable), into a second design structure 920. Design structure 920 resides on a storage medium in a data format used for the exchange of layout data of integrated circuits, for example, information stored in a GDSII (GDS2), GL1, OASIS, or any other suitable format for storing such design structures. Design structure 920 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 3, and 4. Design structure 920 may then proceed to a stage 922 where, for example, design structure 920 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing aperture function calibration for Logic Built In Self Test (LBIST) diagnostics, said method comprising:
providing aperture calibration data;
providing an LBIST calibration channel having a predefined number of scan inversions between the aperture calibration data and a multiple input signature register (MISR);
selecting the LBIST calibration channel, masking other LBIST channels to the MISR, and running LBIST with aperture calibration data;
identifying a change in the MISR value and calculating an aperture adjustment; and
using the calculated aperture adjustment to identify a needed adjustment of aperture edges.

2. The method as recited in claim 1 wherein running LBIST with aperture calibration data includes adjusting an aperture function edge value.

3. The method as recited in claim 2 includes decrementing an aperture function upper edge value.

4. The method as recited in claim 2 includes incrementing an aperture function lower edge value.

5. The method as recited in claim 1 wherein using the calculated aperture adjustment to identify a needed adjustment of aperture edges includes comparing the calculated aperture adjustment and an expected aperture function edge value, and responsive to identifying a match, identifying no needed aperture function edge adjustment.

6. The method as recited in claim 1 includes using the calculated aperture adjustment to identify a needed adjustment of aperture edges includes comparing the calculated aperture adjustment and an expected aperture function edge value, and responsive to identifying a difference of the compared values, identifying a needed aperture function edge adjustment.

7. A circuit for implementing aperture function calibration for Logic Built In Self Test (LBIST) diagnostics comprising:
aperture calibration data;
an LBIST calibration channel having a predefined number of scan inversions coupled between the aperture calibration data and a multiple input signature register (MISR);
a LBIST controller including LBIST control;
said LBIST control selecting the LBIST calibration channel, masking other LBIST channels to the MISR, and running LBIST with aperture calibration data;
said LBIST control identifying a change in the MISR value and calculating an aperture adjustment; and
said LBIST control using the calculated aperture adjustment to identify a needed adjustment of aperture edges.

8. The circuit as recited in claim 7 wherein said LBIST control includes an LBIST control computer program product tangibly embodied on a non-transitory computer readable storage medium and wherein said LBIST control running LBIST with aperture calibration data includes said LBIST control adjusting an aperture function edge value.

9. The circuit as recited in claim 8 includes said LBIST control decrementing an aperture function upper edge value.

10. The circuit as recited in claim 8 includes said LBIST control incrementing an aperture function lower edge value.

11. The circuit as recited in claim 7 includes said LBIST control using the calculated aperture adjustment to identify a needed adjustment of aperture edges includes said LBIST control comparing the calculated aperture adjustment and an expected aperture function edge value, and responsive to identifying a match, identifying no needed aperture function edge adjustment.

12. The circuit as recited in claim 7 includes said LBIST control using the calculated aperture adjustment to identify a needed adjustment of aperture edges includes said LBIST control comparing the calculated aperture adjustment and an expected aperture function edge value, and responsive to identifying a difference of the compared values, identifying a needed aperture function edge adjustment.

13. The circuit as recited in claim 7 wherein said LBIST control using the calculated aperture adjustment to identify a needed adjustment of aperture edges includes said LBIST control comparing the calculated aperture adjustment and an expected aperture function edge value for a lower edge, and said LBIST control comparing the calculated aperture adjustment and an expected aperture function edge value for an upper edge.

14. A design structure embodied in a non-transitory computer readable storage medium used in a design process, the design structure comprising:
a circuit tangibly embodied in the non-transitory computer readable storage medium used in the design process, said circuit for implementing aperture function calibration for Logic Built In Self Test (LBIST) diagnostics, said circuit comprising:
aperture calibration data;
an LBIST calibration channel having a predefined number of scan inversions coupled between the aperture calibration data and a multiple input signature register (MISR);
a LBIST controller including LBIST control, said LBIST control selecting the LBIST calibration channel, masking other LBIST channels to the MISR, and running LBIST with aperture calibration data;
said LBIST control identifying a change in the MISR value and calculating an aperture adjustment; and
said LBIST control using the calculated aperture adjustment to identify a needed adjustment of aperture edges, wherein the design structure, when read and used in the manufacture of a semiconductor chip produces a chip comprising said test circuit.

15. The design structure of claim 14, wherein the design structure comprises a netlist, which describes said circuit.

16. The design structure of claim 14, wherein the design structure resides on storage medium as a data format used for the exchange of layout data of integrated circuits.

17. The design structure of claim 14, wherein the design structure includes at least one of test data files, characterization data, verification data, or design specifications.

18. The design structure of claim 14, wherein said LBIST control running LBIST with aperture calibration data includes said LBIST control adjusting an aperture function edge value; and includes said LBIST control decrementing an aperture function upper edge value, and said LBIST control incrementing an aperture function lower edge value.

19. The design structure of claim 18, includes said LBIST control responsive to identifying a match of said compared values, identifying no needed aperture function edge adjustment.

20. The design structure of claim 14, wherein said LBIST control using the calculated aperture adjustment to identify a needed adjustment of aperture edges includes said LBIST control comparing the calculated aperture adjustment and an expected aperture function edge value for a lower edge, and said LBIST control comparing the calculated aperture adjustment and an expected aperture function edge value for an upper edge.

\* \* \* \* \*